United States Patent [19]

Bindell et al.

[11] Patent Number: 5,194,117
[45] Date of Patent: Mar. 16, 1993

[54] LITHIUM NIOBATE ETCHANT

[75] Inventors: Jeffrey B. Bindell, South Whitehall Township, Lehigh County; James T. Cargo, Bethlehem; Ronald J. A. Holmes, Greenwich Township, Berks County; Michael C. Hughes, Lehigh Township, Northampton County, all of Pa.

[73] Assignee: AT&T Bell Laboratories, Murray Hill, N.J.

[21] Appl. No.: 712,234

[22] Filed: Jun. 7, 1991

Related U.S. Application Data

[63] Continuation-in-part of Ser. No. 485,689, Feb. 27, 1990, abandoned.

[51] Int. Cl.[5] .................... C03C 15/00; C03C 21/00
[52] U.S. Cl. .................... 156/628; 156/656; 156/657; 156/667; 65/30.1; 65/30.13; 65/31
[58] Field of Search ............... 156/628, 656, 667, 657; 65/30.13, 31, 30.1

[56] References Cited

U.S. PATENT DOCUMENTS

| 4,094,677 | 6/1978 | Weirauch ........................... 96/36 |
| 4,284,663 | 8/1981 | Carruthers et al. .................. 427/164 |
| 4,598,039 | 7/1986 | Fischer et al. ....................... 430/323 |
| 4,838,989 | 6/1989 | Ashby et al. ......................... 156/628 |

FOREIGN PATENT DOCUMENTS 64-5998  1/1989  Japan ................................ 156/628

Primary Examiner—Thi Dang
Attorney, Agent, or Firm—R. D. Laumann

[57] ABSTRACT

Oxides of tantalum and niobium are selectively etched using patterned silicon oxide deposited by a low-temperature chemical vapor deposition as a mask and a sulfate flux to selectively remove exposed portions of the tantalum or niobium oxide substrate.

12 Claims, 1 Drawing Sheet

LITHIUM NIOBATE ETCHANT

TECHNICAL FIELD

This application is a continuation-in-part of application Ser. No. 07/485,689 (J. B. Bindell 3-1-4-1) filed on Feb. 27, 1990, entitled "Method for Etching Niobium and Tantalum Oxides", now abandoned.

BACKGROUND OF THE INVENTION

This invention relates to a method of etching materials, such as lithium niobate, useful in optical or surface acoustic wave devices.

Structures which guide optical radiation without substantial loss of energy are of interest for many applications including communications, remote sensing, etc. Such structures are commonly referred to as waveguides and have a region of a first refractive index at least partially surrounded by a region of a second refractive index with the second refractive index being lower than the first refractive index. The refractive index difference provides the guiding mechanism for the optical radiation. The optical energy density is higher in the high refractive index region than it is in the low refractive index region.

Although many materials have been investigated for possible use in optical waveguides and, in fact, silica-based compositions are presently used for optical transmission lines, one material of special interest for waveguides is lithium niobate ($LiNbO_3$). This birefringent material has relatively large electro-optic coefficients which are of interest in optical devices, such as switches, polarizers, etc. Several techniques have been developed for fabricating waveguides in $LiNbO_3$. One exemplary method of fabricating waveguides in $LiNbO_3$ and other materials is described in U.S. Pat. No. 4,284,663, issued Aug. 18, 1981 to Carruthers et al. A transition metal diffusant is deposited on a major surface of the optically transparent material, typically a single crystal, and is then induffused into the crystal by heating to a temperature between 800° C. and 1100° C. for a suitable period of time. The metal diffusant, e.g., titanium, increases the refractive index of the crystal by approximately one percent which is sufficient to guide both polarizations of optical radiation. If an active optical device is desired, second metal may be deposited on the same major surface, after deposition of a suitable dielectric buffer layer, and patterned to form electrodes so that functions such as switching, modulating, polarizing, etc., may be performed.

Of course, optical structures other than waveguides are of interest. For example, optical gratings can be used to select particular frequencies of radiation from a spectrum by either transmitting or reflecting the desired frequencies. Lithium niobate can be used for gratings as well as waveguides. U.S. Pat. No. 4,094,677, issued on Jun. 13, 1978, describes a technique for fabricating gratings by etching features in a $LiNbO_3$ crystal using HF acid and a patterned gold/chromium mask. Gratings stated to be suitable for use in surface acoustic wave devices were obtained. Chemical etching is thus one technique used to remove material selectively and fabricate features, but other techniques have been developed which selectively remove material. For example, U.S. Pat. No. 4,598,039, issued on Jul. 1, 1986 to Fischer et al., teaches a method of forming features in, e.g., $LiNbO_3$, by using electromagnetic energy, e.g., to selectively remove material. This technique is useful in forming waveguides as well as gratings. The technique is also useful with other optical materials, including tantalum, niobium, barium, or strontium oxides such as lithium tantalate ($LiTaO_3$), strontium barium niobate ($SrBaNbO_3$), and still others.

The removal of material to form features in $LiNbO_3$ is of interest to those skilled in the art because a large difference in refractive index can be obtained; i.e., the difference between the refractive indices of $LiNbO_3$ and air is easily obtained. This refractive index difference is generally larger than that obtained by the indiffusion technique previously described although the presence of a passivation layer might reduce the difference. Neither removal technique, at least at the present time, produces the high-quality optical surfaces that are essential in many optical devices to insure low scattering losses from the waveguide. Moreover, the latter removal technique described suffers from the potential drawback that the radiation used may create defects in the $LiNbO_3$ crystal when energy is absorbed. This, in turn, affects the electro-optic performance of the device and increases the optical propagation loss. The former removal technique described suffers from several drawbacks, including a relatively slow etching rate. A period of 4 to 12 hours, or more, is described as typical with the longer times being required for deeper etching. Additionally, this etch does not isotropically etch the $+C$ and $-C$ regions of the crystal at the same rate. If domains are present, the surface is decorated and scattering centers are present.

Techniques have been developed which separate niobium oxides from other compounds for analytical purposes, such as the analysis of ores. One technique uses fusion with fluxes. The fluxes are typically very strongly acidic or basic. For example, niobium oxide can be separated from the other components in ores by fusion with potassium bisulfate followed by rinsing in, e.g., water, dilute acids such as $HNO_3$, or complexing organic acids such as tartaric acid. However, fluxes have not been successfully used in fabricating optical devices in niobium oxides such as lithium niobate. This may be because fluxing has been thought of as a dissolution technique rather than an etching technique, or because of a lack of a suitable mask material; i.e., a material that reacts with the flux considerably more slowly than does the lithium niobate and which can be deposited and removed without adversely affecting the quality of the lithium niobate. Due to the chemical similarities of tantalum and niobium, techniques applicable to niobium are generally applicable to tantalum.

SUMMARY OF THE INVENTION

Devices comprising a substrate comprising at least one composition selected from the group consisting of niobium or tantalum oxides are made by patterning a mask material on a surface of said substrate to expose selected portions of the substrate and subjecting the exposed portions of the substrate to a fluxing compound comprising a Group IA or Group IIA compound or an ammonium ion. Group IA metals are Li, Na, K, Rb, and Cs; Group IIA metals are Be, Mg, Ca, Sr, and Ba. The fluxing compound dissolves the exposed portion of the substrate to yield material which can be removed. That is, the fluxing compound reacts with substrate material. This material is then removed. A relatively low temperature, less than approximately 400° C., is used during the fluxing process. In a preferred embodiment, the oxide comprises at least one composition selected from the group consisting of $LiNbO_3$, $LiTaO_3$, $K(Ta,Nb)O_3$, $Sr_{1-x}Ba_xNb_2O_6$, and $Na_{(1-2x)}Ba_xNb_2O_6$. These compounds are of interest for their electro-optic, piezo-electric, and ferro-electric characteristics. In a still further preferred embodiment, exemplary fluxing compounds are carbonate, acid sulfate, or sulfate salts, such as $Na_2CO_3$, $(NH_4)_2SO_4$, $Na_2SO_4$, $NaHSO_4$, $K_2SO_4$, $NaHCO_3$ $NH_4HSO_4$, or $KHSO_4$ with or without the presence of $H_2SO_4$ or ammonium salts. The presence of the $H_2SO_4$ slows the reaction of $SO_4$ with the lithium niobate. In yet another preferred embodiment, the reacted material is dissolved in water or an acid, such as dilute $H_2SO_4$, if it is not already liquid. After etching has been completed, the mask can be stripped, and additional fabrication steps performed. Structures which may be fabricated by our method include rib waveguides, polarizers, modulators, gratings, etc. If desired, electrodes may be fabricated where appropriate.

BRIEF DESCRIPTION OF THE DRAWING

For reasons of clarity, elements of the devices depicted are not drawn to scale. Identical numerals in different figures represent identical elements.

DETAILED DESCRIPTION

Figure 1:
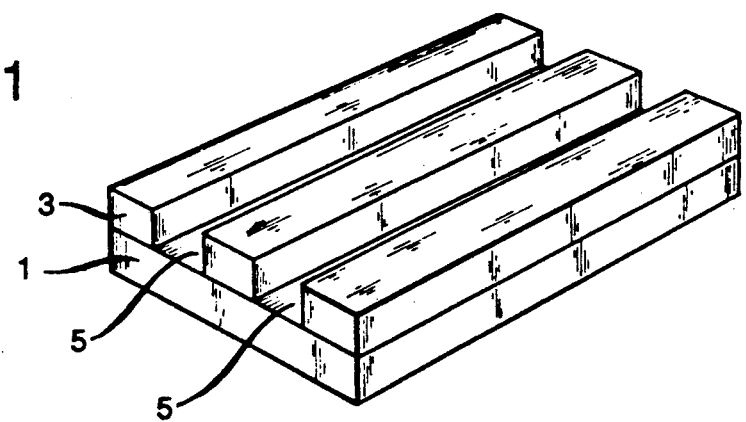
FIG. 1 is a perspective view of a device at an intermediate stage of fabrication.

Depicted in FIG. 1 are substrate 1 and patterned mask layer 3 which exposes selected portions of substrate 1. Substrate 1 will be selectively etched in the device fabrication process. Mask layer 3 is deposited and patterned by conventional techniques.

The substrate comprises at least one composition selected from the group consisting of niobium and tantalum oxides. It is well known to those skilled in the art that niobium and tantalum are very similar chemically and frequently have generally similar physical characteristics. Other elements, such as Li, K, Na, Sr and Ba, may also be present in the composition. Preferred oxides include those having the nominal stoichiometries, $LiNbO_3$, $LiTaO_3$, $K(Ta,Nb)O_3$, $Sr_{1-x}Ba_xNb_2O_6$, $Na_{(1-2x)}Ba_xNb_2O_6$. It is also contemplated that there may be deviations from the nominal stoichiometry. In fact, the lithium niobate typically used in optical devices is generally somewhat lithium deficient. The compositions stated may additionally have minor additions of other elements which may be added to the substrate for various purposes or may be present inadvertently. These compositions are of interest for their optical, electro-optic, piezo-electric, and ferro-electric characteristics.

In a preferred embodiment, mask material 3 comprises a deposited silicon-based oxide which is deposited by, e.g., chemical vapor deposition. That is, the mask material comprises silicon oxide having the nominal stoichiometry $SiO_2$. It is contemplated that deviations from the nominal stoichiometry may be present and/or that there may be minor additions of other elements, such as phosphorus, boron, or arsenic, to the mask material. The additions should not contaminate oxides such as the $LiNbO_3$ optically; i.e., they should not degrade the optical properties of the $LiNbO_3$. The silicon oxide is desirably deposited at a temperature less than 500° C. because such a relatively low temperature is likely to minimize any adverse effects, e.g., volatilization of lithium from the substrate or substrate—film eutectic formation, upon the crystal structure or the composition of the underlying substrate. Deposition techniques for such an oxide are well known to those skilled in the art and need not be described in detail.

Standard lithographic patterning techniques are used to selectively remove portions of the mask material and thereby expose selected portions of the underlying substrate 1. As shown in FIG. 1, there are two parallel rows 5 from which mask material 3 has been selectively removed to expose portions of the substrate. Techniques for patterning silicon oxide based materials are well known to those skilled in the art and, accordingly, need not be described in further detail. Dimensions will be readily selected by those skilled in the art and will, of course, depend upon the type of device being fabricated. Features as deep as the mask is thick can be readily fabricated with an oxide mask.

The mask pattern depicted is useful in fabricating a rib wave-guide or a similar structure because the exposed portions of the substrate can now be selectively removed by using the etching procedure of this invention. This procedure will produce grooves in the substrate where the mask material has been removed. Fluxing compounds comprising Group IA or Group IIA compounds, i.e., compounds containing Group 1A or Group IIA metals, or ammonium ions may be used. A fluxing compound is one which dissolves the substrate. Particularly useful fluxing compounds, according to this invention, are acid compound fluxes, such as sulfate or acid sulfate fluxes, formed from ($KHSO_4$ or $NH_4SO_4$), or basic compound fluxes, such as carbonate ($Na_2CO_3$). Thus, sulfate, acid sulfate, carbonate or ammonium salts are useful. Other useful salts include $Na_2SO_4$, $NaHSO_4$, $K_2SO_4$, $NaHCO_3$, and $NH_4HSO_4$. The acidic compounds are preferred over the basic compounds as they do not attack the silicon oxide mask material as readily. The successful use of such fluxing compounds in patterning the underlying substrate, comprising Nb or Ta oxide material, is surprising because it is well known that these fluxing compounds also react with silicon oxide. Thus, the successful use of the fluxing compounds in patterning the material, i.e., the substrate, is predicated on the fact that there is a high etch rate differential between the silicon oxide based mask material and the underlying oxide material.

A flux is conveniently formed by putting the fluxing compound, e.g., solid salt, in a crucible and heating until the salt is melted or forms a viscous liquid. For example, $KHSO_4$ heated to 225° C. melts and forms a somewhat viscous liquid. If a liquid flux is desired at ambient temperature, an appropriate amount of an acid, such as $H_2SO_4$, may be added. The crystal, with the patterned mask, is exposed to the fluxing compound by being immersed in the flux. As the flux is at a temperature greater than the ambient temperature, care must be taken to avoid excessive thermal stress to the crystal as it is lowered into the flux.

The fluxes are highly acidic or basic and are not generally neutralized by water prior to patterning. The elevated temperature leads to a higher reaction rate than would be present at ambient temperatures. The temperature is desirably approximately 400° C. or less. The flux forms a soluble salt with niobic acid or forms oxyanions of Li or Nb which, in turn form soluble salts. Appropriate solvents will be readily selected by those skilled in the art.

The fluxes work with CVD oxides deposited at relatively low temperatures, i.e., temperatures less than 500° C. This is surprising because such oxides typically have a lower density than do oxides deposited at higher temperatures. It would be expected that the lower density oxides would be more readily etched than would be the higher density oxides and that the differential etch rate between the silicon oxide and the underlying optical material would be too small to fabricate useful optical devices in the substrate. In fact, grooves as deep as 0.5 $\mu$m can be fabricated in times as short as 1 minute of flux using the method of this invention with mask material 0.5 $\mu$m thick. The high temperature limit is likely to be determined by the difference between the thermal expansion coefficients of the mask and the lithium niobate. If a slower reaction rate is desired, an acid, such as $H_2SO_4$, may be added to the flux.

Figure 2:
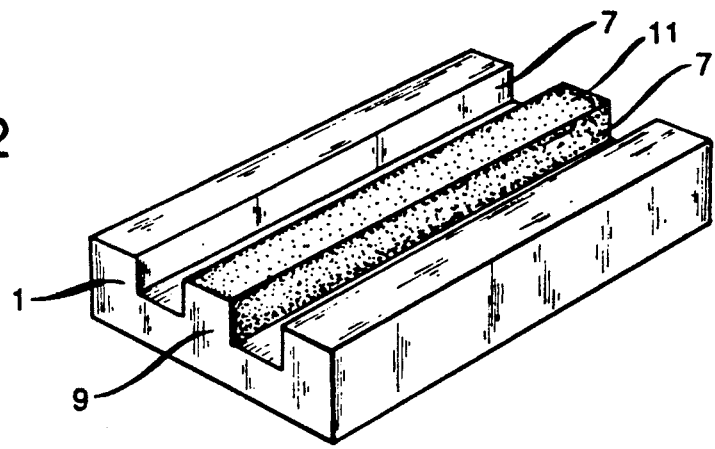
FIG. 2 is a perspective view of a rib wave-guide fabricated according to one embodiment of this invention.

A rib waveguide is depicted in FIG. 2 which shows grooves 7 in the substrate on opposite sides of the rib 9. The mask material has been stripped and an electrode 11 deposited on the rib 9. The etched surfaces of the waveguide are flat when examined on a scale of 0.5 $\mu$m; the maximum deviation from the nominal edge of the waveguide is less than 0.05 $\mu$m. A ridge waveguide with electrodes on all faces of the ridge provides optimum control over the electro-optic changes sought in a crystal. One skilled in the art will readily select an appropriate crystal orientation and electro-optic tensor.

Figure 3:
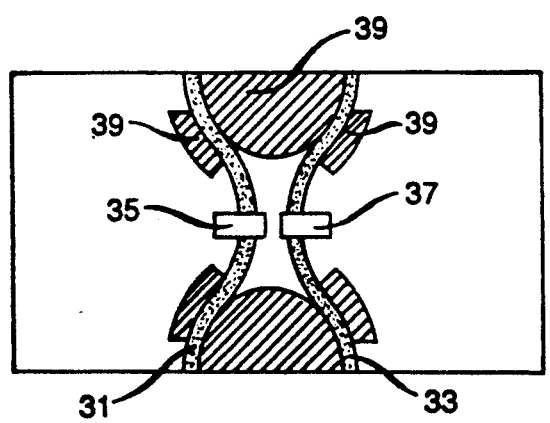
FIG. 3 is a top view of an optical modulator fabricated according to another embodiment of this invention.

FIG. 3 is a top view of another device fabricated according to an embodiment of our invention. Depicted are waveguides 31 and 33 and electrodes 35 and 37 which electrically contact waveguides 31 and 33, respectively. The cross-hatched areas 39 have been removed from the substrate by etching to a reasonable depth considering the transverse dimensions of the waveguides. One skilled in the art will readily select an appropriate depth. As can be seen, the waveguides curve and approach each other in the area where the electrodes are placed. This enables the device depicted, due to the electro-optic characteristics of the underlying optical material, to function as a switch, i.e., optical radiation can be transferred from waveguide 31 to waveguide 33. The etched areas 39 permit sharp bends by reducing optical propagation losses in the bends as compared to the losses if the etched areas were absent. Appropriate techniques for depositing and patterning the metal for the electrodes will be readily known to those skilled in the art and need not be described. It should be noted that the metal for the electrodes is typically deposited and patterned after the etch. The metal might also be passivated by, e.g., a ceramic cap layer, a material resistant to the flux.

Figure 4:
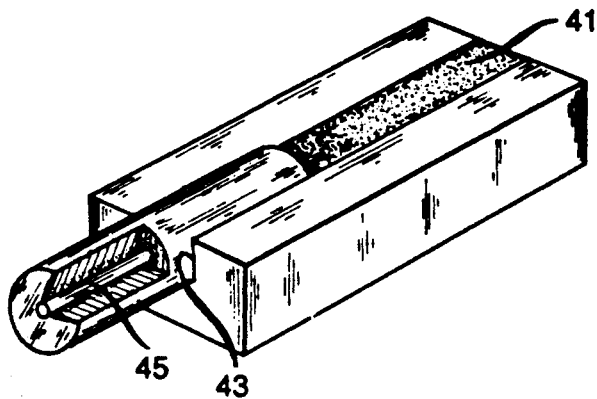
FIG. 4 is a top perspective view of a device according to yet another embodiment of this invention having a channel for an optical fiber.

FIG. 4 is a top view of another device fabricated according to another embodiment of invention. The device comprises a lithium niobate substrate having a diffused waveguide 41 and a groove 43. Placed in the groove 43 is optical fiber 45. The proximity of the waveguide to the optical fiber permits light to be coupled from fiber to the waveguide, and vice versa, with low losses. Appropriate lithographic patterning techniques fabricate the structure and will be apparent to those skilled in the art after reading the previous discussions.

The technique can also be used to isolate devices to prevent cross-talk between optical waveguides. Material can be removed at the intersection of cross-over waveguides for the same purposes. Bend loss can be substantially eliminated by etching away material at the bend, thereby permitting a higher density of devices on the substrate. Polarization splitters which remove an unwanted polarization from the waveguide can be produced by this method. The method may also be used to chemically polish the substrate surface to remove damage caused by mechanical polishing.

Still other variations and embodiments of our invention will be readily apparent to those skilled in the art. For example, waveguide intersections and Mach-Zehnder interferometers will be readily fabricated by those skilled in the art. Additionally, gold or any of the platinum metals may be used as mask materials. That is, any noble metal may be used as a mask material. Metal masks may be removed in aqua regia. Features deeper than the mask is thick may be fabricated with metal masks.

We claim:

1. A method of making a device comprising a substrate, said substrate comprising at least one composition selected from the group consisting of tantalum and niobium oxides, said method comprising:
   depositing a mask material on said substrate;
   patterning said mask material to expose selected portions of said substrate;
   exposing said exposed portions, at a temperature of approximately 400° C. or less, to a liquid fluxing compound comprising at least one Group IA or Group IIA compound or ammonium ions to yield material which can be removed, said fluxing compound comprises at least one member selected from the group consisting of sulfate, acid sulfate, carbonate, and ammonium salts;
   and removing said material which can be removed.

2. A method as recited in claim 1 in which said salt comprises $Na_2CO_3$, $KHSO_4$, $Na_2SO_4$, $NaHSO_4$, $K_2SO_4$, $NaHCO_3$, $NH_4HSO_4$ or $(NH_4)_2SO_4$.

3. A method is recited in claim 1 in which said substrate comprises at least one member selected from the group consisting of $LiNbO_3$, $LiTaO_3$, $K(Ta,Nb)O_3$, $Sr_{1-x}Ba_xNb_2O_6$, and $Na_{(1-2x)}Ba_xNb_2O_6$.

4. A method is recited in claim 3 in which said substrate comprises $LiNbO_3$.

5. A method as recited in claim 4 in which said mask material comprises at least one member selected from the group consisting of noble metals and silicon oxide.

6. A method as recited in claim 5 in which said depositing is by low temperature chemical vapor deposition.

7. A method as recited in claim 1 comprising the further step of stripping said mask material.

8. A method as recited in claim 7 comprising the further step of fabricating electrodes on selected portions of said substrate.

9. A method as recited in claim 1 in which said removing step comprises dissolving said material in water or an acid.

10. A method as recited in claim 1 in which said fluxing compound is combined with $H_2SO_4$.

11. A method as recited in claim 2 in which said salt is combined with $H_2SO_4$.

12. A method as recited in claim 6 in which said mask material comprises silicon oxide.

* * * * *